(12) United States Patent
Park

(10) Patent No.: US 7,956,855 B2
(45) Date of Patent: Jun. 7, 2011

(54) DISPLAY DEVICE USING ENHANCED GATE DRIVER

(75) Inventor: Do-Hyeon Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 997 days.

(21) Appl. No.: 11/486,838

(22) Filed: Jul. 14, 2006

(65) Prior Publication Data

US 2007/0018940 A1   Jan. 25, 2007

(30) Foreign Application Priority Data

Jul. 25, 2005  (KR) ......................... 10-2005-0067334

(51) Int. Cl.
 *G09G 3/36* (2006.01)
(52) U.S. Cl. ........................................ 345/204; 345/100
(58) Field of Classification Search .................... 345/204
 See application file for complete search history.

(56) References Cited

U.S. PATENT DOCUMENTS

| | | | | |
|---|---|---|---|---|
| 5,136,622 A * | 8/1992 | Plus | ................................ | 377/64 |
| 6,151,016 A * | 11/2000 | Kanbe et al. | ................... | 345/204 |
| 6,845,140 B2 * | 1/2005 | Moon et al. | ..................... | 377/78 |
| 6,946,870 B1 * | 9/2005 | Lesea | ............................... | 326/38 |
| 7,106,292 B2 * | 9/2006 | Moon | ........................... | 345/100 |
| 7,355,576 B2 * | 4/2008 | Song | ............................... | 345/87 |
| 7,375,717 B2 * | 5/2008 | Joo | ................................. | 345/99 |
| 7,486,268 B2 * | 2/2009 | Jang et al. | ..................... | 345/100 |
| 7,705,819 B2 * | 4/2010 | Choi et al. | ...................... | 345/98 |
| 2003/0227433 A1 * | 12/2003 | Moon | ........................... | 345/100 |
| 2004/0090412 A1 * | 5/2004 | Jeon et al. | ..................... | 345/100 |
| 2005/0275026 A1 * | 12/2005 | Tsividis et al. | ............... | 257/350 |
| 2007/0182680 A1 * | 8/2007 | Jeon | ................................ | 345/87 |
| 2008/0094531 A1 * | 4/2008 | Lee et al. | ........................ | 349/39 |
| 2009/0040161 A1 * | 2/2009 | Baek et al. | ..................... | 345/94 |
| 2009/0273552 A1 * | 11/2009 | Hwang et al. | .................. | 345/89 |

FOREIGN PATENT DOCUMENTS

WO    2004021322    3/2004

\* cited by examiner

*Primary Examiner* — Bipin Shalwala
*Assistant Examiner* — Afroza Y Chowdhury
(74) *Attorney, Agent, or Firm* — Cantor Colburn LLP

(57) ABSTRACT

A display device includes: a plurality of gate lines for transmitting a gate signal; a plurality of data lines for transmitting a data signal; a plurality of switching elements connected to the gate lines and the data lines; a plurality of pixel electrodes connected to the switching elements; a gate driver connected to the gate lines and including a gate signal generation mechanism for generating the gate signal and applying the gate signal to the gate lines; a data driver for applying the data signal to the data lines; a signal controller for receiving and processing incoming image signals to be supplied to the data driver, the signal controller generating a first gate control signal for controlling the gate driver and generating a data control signal for controlling the data driver; and a signal generator for receiving the first gate control signal and generating second and third gate control signals based on the received first gate control signal, wherein the gate driver is capable of receiving the second and third gate control signals, wherein the gate driver generates the gate signal based on the second and third gate signals, and wherein the period of the first gate control signal is the same as the period of the second and third gate control signals.

29 Claims, 6 Drawing Sheets

DISPLAY DEVICE USING ENHANCED GATE DRIVER

CROSS-REFERENCE TO RELATED APPLICATION

This application claims priority to Korean Patent Application No. 10-2005-0067334 filed in the Korean Intellectual Property Office on Jul. 25, 2005 and all the benefits accruing therefrom under 35 U.S.C. §119, the entire contents of which are incorporated herein by reference.

BACKGROUND OF THE INVENTION (a) Field of the Invention

The present invention relates to a display device.

(b) Description of the Related Art

Recently, flat panel displays such as organic light emitting diode (OLED), electroluminescent (EL), plasma display panel (PDP), and liquid crystal display (LCD) have been actively developed as substitutes for the large and heavy cathode ray tube (CRT).

The PDP displays characters or images using plasma generated by a gas discharge, and the OLED displays characters or images using organic materials which emit light when exposed to an electric field. . The liquid crystal display displays images by applying an electric field in a liquid crystal layer interposed between two panels and regulating the strength of the electric field to adjust the transmittance of light passing through the liquid crystal layer.

Flat panel displays such as the LCD and the OLED, utilize a display panel having pixels that include switching elements. The switching elements are controlled by gate lines and data lines. The gate lines transmit scanning signals to the pixels, thereby turning the switching elements on and off. The data lines transmit image signals to the pixels. A gate driver provides a gate signal for the gate lines. The gate driver may be implemented in the form of at least one chip or integrated into the display panel.

A signal controller capable of processing incoming image data and controlling other elements such as the gate driver, generates a plurality of control signals for the above-described control of the switching elements. A signal generator receives the control signals to generate and provide signals that are directly required by the gate driver. The signal generator is placed between the signal controller and the gate driver.

The signal controller generates various signals such as a scanning start signal specifying application of a gate signal, a gate clock signal for determining the time for applying a pulse of the gate signal, and an output enable signal for determining the pulse width of the gate signal. The signal generator receives these signals and generates signals required by the gate driver. However, production of the aforementioned signals places heavy demands on the signal controller as well as the signal generator. The signal controller and the signal generator utilize complicated structures which are expensive to manufacture.

BRIEF SUMMARY OF THE INVENTION

A motivation of the present invention is to provide a display device solving the above-mentioned and other problems occurring in the prior art.

Exemplary embodiments of the present invention provide a display device including: a plurality of gate lines for transmitting a gate signal; a plurality of data lines for transmitting a data signal; a plurality of switching elements connected to the gate lines and the data lines; a plurality of pixel electrodes connected to the switching elements; a gate driver connected to the gate lines and including a gate signal generation mechanism for generating the gate signal and applying the gate signal to the gate lines; a data driver for applying the data signal to the data lines; a signal controller for receiving and processing incoming image signals to be supplied to the data driver, the signal controller generating a first gate control signal for controlling the gate driver and generating a data control signal for controlling the data driver; and a signal generator for receiving the first gate control signal and generating second and third gate control signals based on the received first gate control signal wherein the gate driver is capable of receiving the second and third gate control signals, wherein the gate driver generates the gate signal based on the second and third gate signals, and wherein the first gate control signal is a periodic signal having a first period, the second gate control signal is a periodic signal having a second period, the third gate control signal is a periodic signal having a third period, and the first period is substantially equal to the second and third periods. Pursuant to further exemplary embodiments, the second gate control signal may have about the same phase as the first gate control signal. The phase difference between the third gate control signal and the second gate control signal may be about 180 degrees. A plurality of gate drivers may be provided, wherein the second gate control signal and the third gate control signal may be supplied to different gate drivers. . The gate signal may include a plurality of pulses. The pulse width of the pulses may be half of one period of each of the first, second, and third gate control signals. The signal generator may be combined with the signal controller. The signal generator may include: an amplifier for amplifying the first gate control signal to generate the second gate control signal; and an inverter for inverting the second gate control signal to generate the third gate control signal.

Another exemplary embodiment of the present invention provides a display device including: a plurality of gate lines for transmitting a gate signal; a plurality of data lines for transmitting a data signal; a plurality of switching elements connected to the gate lines and the data lines; a plurality of pixel electrodes connected to the switching elements; a gate driver connected to the gate lines and including a gate signal generation mechanism for generating the gate signal and applying the gate signal to the gate lines; a data driver for applying the data signal to the data lines; a signal controller for receiving and processing incoming image signals to be supplied to the data driver, the signal controller generating a first gate control signal for controlling the gate driver and generating a data control signal for controlling the data driver; and a signal generator for receiving the first gate control signal and generating second and third gate control signals based on the received first gate control signal, wherein the gate driver is capable of receiving the second and third gate control signals wherein the gate driver generates the gate signal based on the second and third gate signals, wherein the gate signal includes a pulse having a pulse width, and wherein the period of the first gate control signal is about twice the pulse width.

Pursuant to further exemplary embodiments, the second gate control signal may have about the same period and the same phase as the first gate control signal. The phase difference between the third gate control signal and the second gate control signal may be 180 degrees. A plurality of gate drivers may be provided, wherein the second gate control signal and the third gate control signal may be supplied to different gate drivers. The signal generator may include: an amplifier for amplifying the first gate control signal to generate the second gate control signal; and an inverter for inverting the second gate control signal to generate the third gate control signal.

Another exemplary embodiment of the present invention provides a display device including: a plurality of gate lines for transmitting a gate signal; a plurality of data lines for transmitting a data signal; a plurality of switching elements connected to the gate lines and the data lines; a plurality of pixel electrodes connected to the switching elements; a gate driver connected to the gate lines and including a gate signal generation mechanism for generating the gate signal and applying the gate signal to the gate lines; a data driver for applying the data signal to the data lines; and a signal controller for receiving and processing incoming image signals to be supplied to the data driver, the signal controller generating first and second gate control signals for controlling the gate driver and generating a data control signal for controlling the data driver, wherein the signal controller is implemented using one or more integrated circuit chips, wherein the gate driver generates the gate signal based on the first and the second gate signals, wherein the gate signal includes a pulse having a pulse width, wherein the period of the first gate control signal is about equal to the period of the second gate control signal, and the period of the first gate control signal is about equal to twice the pulse width.

Pursuant to further exemplary embodiments, the phase difference between the second gate control signal and the first gate control signal may be 180 degrees. A plurality of gate drivers may be provided, wherein the first gate control signal and the second gate control signal may be supplied to different gate drivers. The signal controller may generate a start signal and apply the start signal to only one gate driver of the plurality of gate drivers. The switching element may include a first thin film transistor, and the first thin film transistor may include amorphous silicon. Each of the stages may include a plurality of second thin film transistors, and the gate lines, the data lines, the first thin film transistor, the pixel electrodes, and the gate drivers may be integrated on a substrate.

Another exemplary embodiment of the present invention provides a gate driving unit, including: a signal controller generating a first gate control signal for controlling a gate driver and generating a data control signal for controlling the data driver; a signal generator for receiving the first gate control signal and generating second and third gate control signals based on the received first gate control signal; wherein the gate driver is capable of receiving the second and third gate control signals, and wherein the first gate control signal is a periodic signal having a first period, the second gate control signal is a periodic signal having a second period, and the third gate control signal is a periodic signal having a third period, and the first period is substantially equal to the second and third periods.

Pursuant to further exemplary embodiments, the first gate control signal has a first phase and the second gate control signal has a second phase, and the first phase is approximately equal to the second phase. The second gate control signal may have a second phase and the third gate control signal has a third phase, and the phase difference between the second phase and the third phase is about 180 degrees. The gate driving unit may further comprise a plurality of gate drivers including at least a first gate driver and a second gate driver, wherein the second gate control signal is supplied to the first gate driver and the third gate control signal is supplied to the second gate driver. The gate signal may include a plurality of pulses. The gate signal may include a pulse sequence comprised of a plurality of periodic pulses each having a pulse width approximately equal to half of the first period. The signal generator may be combined with the signal controller. The signal generator includes: an amplifier for amplifying the first gate control signal to generate the second gate control signal; and an inverter for inverting the second gate control signal to generate the third gate control signal.

BRIEF DESCRIPTION OF THE DRAWINGS

The above and other features and advantages of the present invention will become more apparent by describing exemplary embodiments thereof with reference to the accompanying drawings, in which.

DETAILED DESCRIPTION OF THE INVENTION

Figure 1:
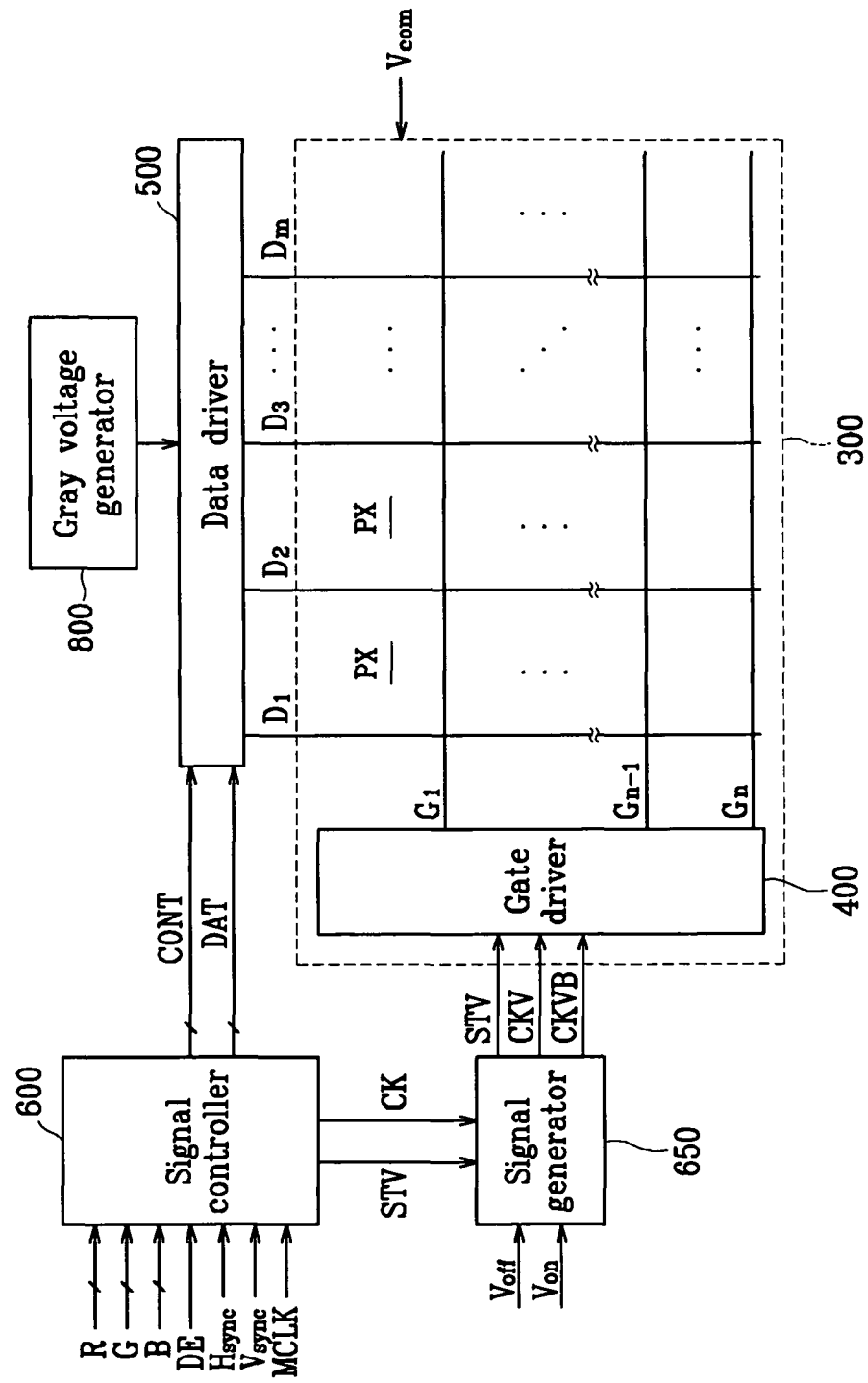
FIG. 1 is a block diagram of an illustrative display device according to an exemplary embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
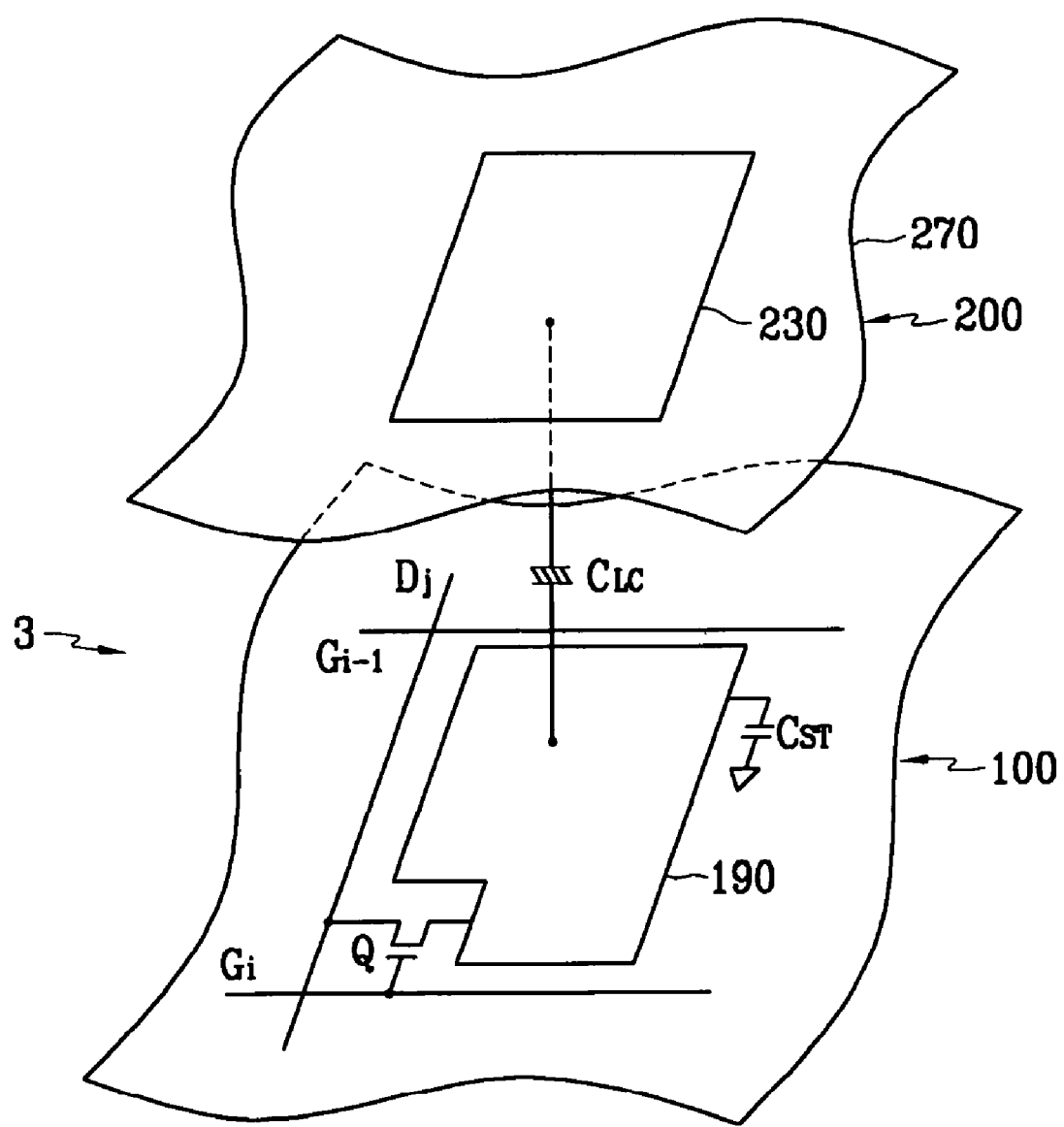
FIG. 2 is an equivalent circuit diagram of a pixel of an LCD according to an exemplary embodiment of the present invention.

First, a display device according to an exemplary embodiment of the present invention will be described in detail with reference to FIG. 1 and FIG. 2. FIG. 1 is a block diagram of a display device according to an exemplary embodiment of the present invention, and FIG. 2 is an equivalent circuit diagram of a pixel of an LCD according to an exemplary embodiment of the present invention.

As shown in FIG. 1, a display device includes a display panel assembly 300, a gate driver 400 and a data driver 500 that are connected to the display panel assembly 300, a gray voltage generator 800 connected to the data driver 500, a signal generator 650 connected to the gate driver 400, and a signal controller 600 connected to the signal generator 650 and the data driver 500 for controlling the signal generator 650 and the data driver 500. The display panel assembly 300 includes a plurality of signal lines and a plurality of pixels PX connected thereto and arranged substantially in a matrix, as seen in the equivalent circuit diagram of FIG. 2. Referring back to FIG. 1, the signal lines include a plurality of gate lines $G_1$-$G_n$ for transmitting gate signals (also referred to as "scanning signals") and a plurality of data lines $D_1$-$D_m$ for transmitting data signals. The gate lines $G_1$-$G_n$ extend substantially in a row direction and substantially parallel to each other, and the data lines $D_1$-$D_m$ extend substantially in a column direction and substantially parallel to each other.

Each pixel PX, for example, the pixel PX connected to the i-th (i=1, 2, ..., n) gate line $G_i$ and the j-th (j=1, 2, ..., m) data line $D_j$, includes a switching element Q (FIG. 2) connected to the signal lines $G_i$ and $D_j$ and a pixel circuit connected to the switching element Q.

The switching element Q, including a thin film transistor, is a three-terminal element provided on the lower panel 100, wherein the control terminal thereof is connected to the gate line $G_i$, and the input terminal thereof is connected to the data line $D_j$, and the output terminal thereof is connected to the liquid crystal capacitor $C_{LC}$ and the storage capacitor $C_{ST}$. Also, the switching element Q may be a thin film transistor and may, but need not, include amorphous silicon.

In the case of an LCD, as representative of all flat panel displays, the display panel assembly 300 thereof includes a lower panel 100, an upper panel 200, and a liquid crystal layer 3 interposed therebetween as illustrated in FIG. 2, and the signal lines $G_1$-$G_n$ and $D_1$-$D_m$ and the switching elements Q are provided on the lower panel 100. The pixel circuit of the liquid crystal display includes a liquid crystal capacitor $C_{LC}$ and a storage capacitor $C_{ST}$ that are connected to the switching element Q. Optionally, the storage capacitor $C_{ST}$ may be omitted.

The liquid crystal capacitor $C_{LC}$ includes a pixel electrode 190 provided on the lower panel 100 and a common electrode 270 provided on the upper panel 200. Accordingly, the pixel electrode 190 and the common electrode 270 represent two terminals of the liquid crystal capacitor $C_{LC}$. The liquid crystal layer 3 disposed between the two electrodes 190 and 270 functions as a dielectric material of the liquid crystal capacitor $C_{LC}$. The pixel electrode 190 is connected to the switching element Q and the common electrode 270 is formed on the entire surface of the upper panel 200 and supplied with a common voltage Vcom. Alternatively or in addition to the arrangement of FIG. 2, the common electrode 270 may be provided on the lower panel 100, and in this case, at least one of the two electrodes 190 and 270 may have the shape of a stripe or bar.

The storage capacitor $C_{ST}$, functioning as an auxiliary capacitor for the liquid crystal capacitor $C_{LC}$, may be formed by overlapping an optional signal line (not 5 shown) provided on the lower panel 100 with the pixel electrode 190 via an insulator disposed therebetween. This optional signal line may be supplied with a predetermined voltage such as a common voltage Vcom. Alternatively, the storage capacitor $C_{ST}$ may be formed by overlapping the pixel electrode 190 with a gate line situated above the pixel electrode via an insulator.

In order to implement color display, each pixel PX is capable of displaying one primary color, (spatial division) or each pixel PX sequentially displays primary colors in turn (temporal division) so that the spatial or temporal sum of the primary colors is recognized as a displayed color. An example of a set of primary colors includes red, green, and blue. FIG. 2 shows an example of the spatial division in which each pixel includes a color filter 230 representing one of the primary colors in an area of the upper panel 200 facing the pixel electrode 190. Alternatively or in addition to the arrangement of FIG. 2, the color filter 230 may be provided on or under the pixel electrode 190 on the lower panel 100. Optionally, one or more polarizers (not shown) for polarizing light are attached on the outer surface of at least one of the two panels 100 and 200 in the display panel assembly 300 of the liquid crystal display.

Referring to FIG. 1, the gray voltage generator 800 generates a plurality of gray signals (or reference gray signals) related to the luminance of the pixels PX. The gate driver 400 is connected to the gate lines $G_1$-$G_n$ of the display panel assembly 300 and applies gate signals to the gate lines $G_1$-$G_n$. The gate driver 400 may, but need not, be formed through the same process as the switching elements Q of the pixels PX and integrated into the display panel assembly 300.

The signal generator 650 generates a plurality of signals for controlling the gate driver 400 that are applied to the gate driver 400. The data driver 500 is connected to the data lines $D_1$-$D_m$ of the display panel assembly 300 and applies data signals, which are selected from the gray signals supplied from the gray voltage generator 800, to the data lines $D_1$-$D_m$. However, in cases where the gray voltage generator 800 does not supply signals corresponding to all gray levels but supplies only reference signals corresponding to a predetermined number of gray levels, the data driver 500 generates gray signals for all gray levels, preferably by dividing voltages on the basis of the reference gray signals, from which data signals are selected.

The signal controller 600 controls the operation of the signal generator 650, the gate driver 400, and the data driver 500. Each of the driving elements 400, 500, 600, 650, and 800 mentioned above may be directly mounted on the display panel assembly 300 in the form of at least one integrated circuit (IC) chip, or may be mounted on a flexible printed circuit film (not shown) to be attached to the display panel assembly 300 in a tape carrier package (TCP) form, or may be mounted on a separate printed circuit board (not shown). On the other hand, these driving elements 400, 500, 600, 650, and 800 may be integrated into the display panel assembly 300 along with the signal lines $G_1$-$G_n$ and $D_1$-$D_m$ and the TFT switching elements Q. Also, one or more of the driving elements 400, 500, 600, 650, and 800 may be integrated into one or more chips and if so integrated, one or more circuit elements of these driving elements may be located outside of the chip.

Next, the operation of the display device mentioned above will be described in more detail. The signal controller 600 receives input image signals R, G, and B and input control signals controlling the display of the image signals from an external graphics controller (not shown). The input image signals R, G, and B include luminance information of each pixel PX and the luminance has a predetermined number of, for example, $1024(=2^{10})$, $256(=2^8)$, or $64(=2^6)$ gray levels. The input control signals include, for example, a vertical synchronization signal Vsync, a horizontal synchronization signal Hsync, a main clock MCLK, and a data enable signal DE.

On the basis of the input control signals and the input image signals R, G and B, the signal controller 600 processes the input image signals R, G, and B suitably for driving the display panel assembly 300. The signal controller 600 also generates gate control signals and data control signals CONT. Then, the signal controller 600 transmits the gate control signals to the signal generator 650 and transmits the processed image signals DAT and the data control signals CONT to the data driver 500.

The gate control signals include a scanning start signal STV for instructing to start scanning and a clock signal CK for controlling the output time of the gate-on voltage Von. The data control signals CONT include a horizontal synchronization start signal STH for informing a start of transmitting digital image signals DAT for a row of pixels PX, a load signal LOAD for instructing to apply analog data signals to the data lines $D_1$-$D_m$, and a data clock signal HCLK. The data control signal CONT may further include an inversion signal RVS for reversing the polarity of the analog data signals with respect to the common voltage Vcom (hereinafter, the "polarity of the data signals with respect to the common voltage Vcom" is referred to as "polarity of the data signals").

Responding to the data control signals CONT from the signal controller 600, the data driver 500 sequentially receives the digital image signals DAT for a row of pixels PX, selects gray voltages corresponding to the respective digital image signals DAT, thereby converting the digital image signals DAT into analog data signals, which are applied to the corresponding data lines $D_1$-$D_m$.

The signal generator 650 receives a gate-on voltage Von having an intensity that can turn on the switching elements Q, and a gate-off voltage Voff having an intensity that can turn off the switching elements Q. The signal generator then generates a pair of clock signals CKV and CKVB having opposite phases with respect to one another by processing the clock signal CK from the signal controller 600. The period of the clock signals CKV and CKVB is equal to the period of the clock signal CK. The phase of the clock signal CKV may be the same as the phase of the clock signal CK. The signal generator 650 applies the scanning start signal STV supplied from the signal controller 600 and the pair of clock signals CKV and CKVB to the gate driver 400.

The gate driver 400 applies the gate signals including the gate-on voltage Von and the gate-off voltage Voff to the gate lines $G_1$-$G_n$ in response to the scanning start signal STV and the pair of clock signals CKV and CKVB from the signal generator 650, thereby turning on or off the switching elements Q connected to the gate lines $G_1$-$G_n$. Then, when the switching elements Q are turned on, the data signals applied to the data lines $D_1$-$D_m$ are applied to the corresponding pixels PX through the turned-on switching elements Q. Here, the interval in which the gate signal is the gate-on voltage Von can be seen as one pulse, the width of which is half of the width of the clock signals CKV and CKVB.

In the LCD illustrated in FIG. 2, the difference between the voltage of the data signal applied to the pixel PX and the common voltage Vcom appears as a charge voltage of the liquid crystal capacitor $C_{LC}$, that is, a pixel voltage. The arrangement of liquid crystal molecules varies depending on the size of the pixel voltages. Thus, the polarization of light passing through the liquid crystal layer 3 varies. This change of the light polarization causes a change of light transmittance through the polarizers attached to the display panel assembly 300, and in this way, the pixels PX display images having the luminance represented by the gray levels of the image signals DAT.

By repeating this procedure by a unit of the horizontal period (which is also denoted as "1H", equal to one period of the horizontal synchronization signal Hsync and the data enable signal DE), all gate lines $G_1$-$G_n$ are sequentially supplied with the gate-on voltage Von, thereby applying the data signals to all pixels PX to display an image for a frame.

In the LCD illustrated in FIG. 2, when the next frame starts after one frame is finished, the inversion signal RVS applied to the data driver 500 is controlled such that the polarity of the data signals applied to each pixel PX is reversed to be opposite the polarity of the previous frame (which is referred to as "frame inversion"). Here, even in one frame, the polarity of the data signals flowing in a data line may vary (for example, row inversion or dot inversion) or the polarities of the data signals applied to the pixels in a row may be different from each other (for example, column inversion or dot inversion) in accordance with the characteristics of the inversion signal RVS.

Figure 3:
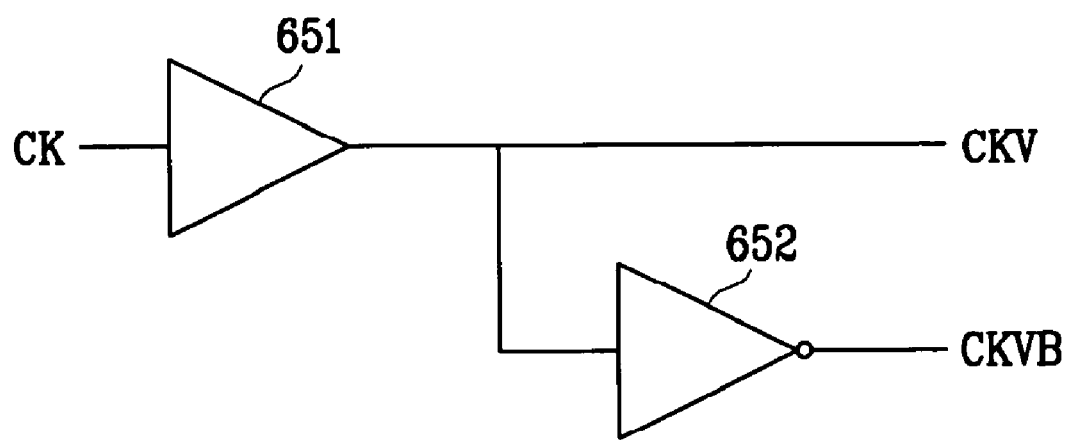
FIG. 3 is a circuit diagram illustrating a clock signal generating block of a signal generator according to an exemplary embodiment of the present invention.
Figure 6:
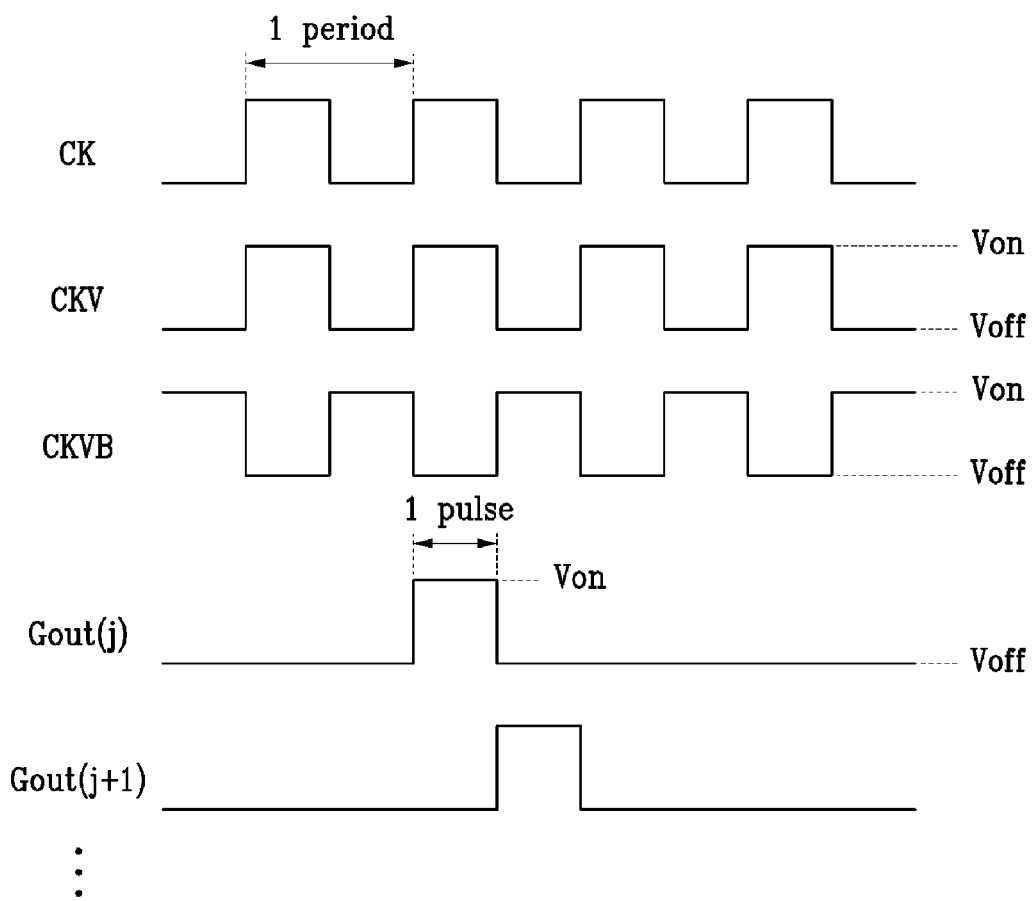
FIG. 6 is a signal timing diagram illustrating signals of the exemplary embodiment of the display device shown in FIG. 1.

A portion of a signal generator constructed according to an exemplary embodiment of the present invention will be described in detail with reference to FIGS. 3 and 6. More specifically, FIG. 3 is a circuit diagram illustrating a clock signal generating block of a signal generator, and FIG. 6 is a signal timing diagram illustrating signals of the exemplary embodiment of the display device shown in FIG. 1.

A signal generator according to the present exemplary embodiment includes an amplifier 651 and an inverter 652. The amplifier 651 receives a clock signal CK from the signal controller 600 and amplifies the clock signal CK to the level of the gate-on voltage Von and the gate-off voltage Voff, and the inverter 652 inverts the amplified signal again. In this way, the output of the amplifier 651 becomes the clock signal CKV and the output of the inverter 652 becomes the clock signal CKVB.

This signal generator 650 may be united with the signal controller 600 to be formed into a chipand, in this case, the clock signal CK is not separately generated, but only a pair of clock signals CKV and CKVB having opposite phases with respect to one another are generated.

Figure 4:
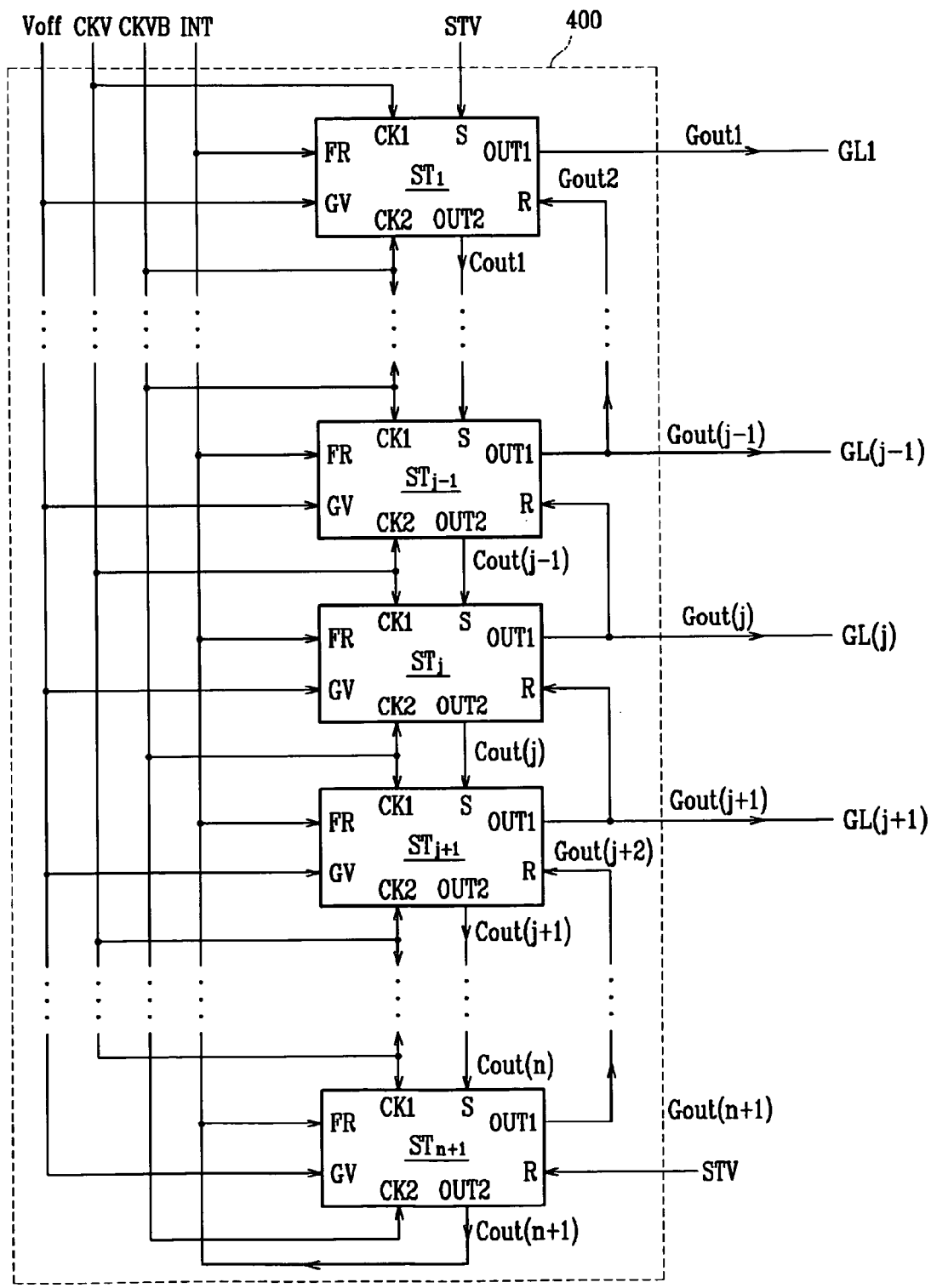
FIG. 4 is an exemplary block diagram of the gate driver illustrated in FIG. 1.
Figure 5:
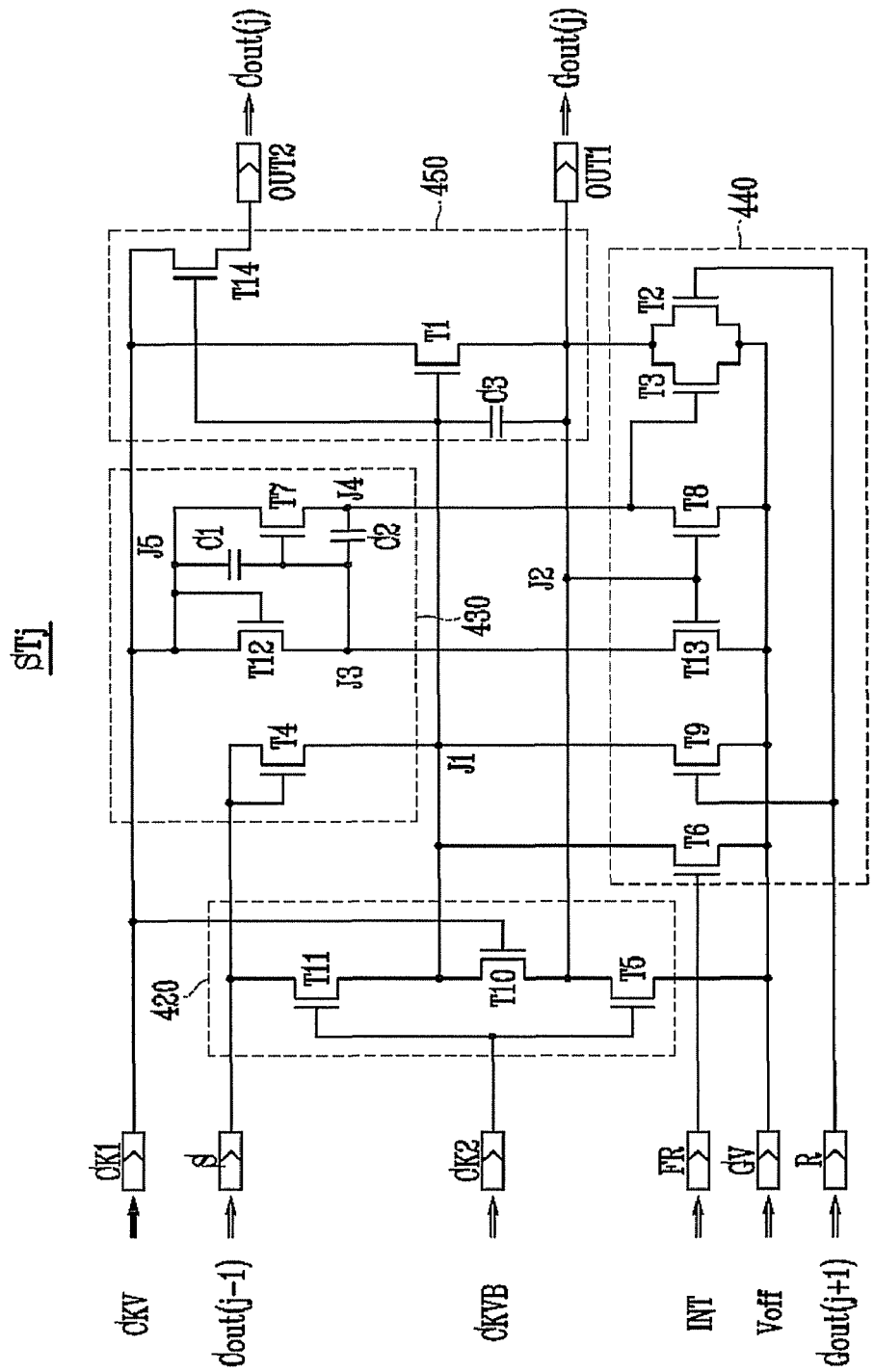
FIG. 5 is an exemplary circuit diagram illustrating one stage of the gate driver shown in FIG. 4.

A TFT array panel and a display device according to an exemplary embodiment of the present invention will now be described in detail with reference to FIGS. 4 and 5. FIG. 4 is an exemplary block diagram of the gate driver illustrated in FIG. 1, and FIG. 5 is an exemplary circuit diagram illustrating one stage of the gate driver shown in FIG. 4. Referring to FIGS. 4 5, the gate driver 400 includes a gate signal generation mechanism, illustratively in the form of a plurality of interconnected stages $ST_1$-$ST_{n+1}$ for sequentially outputting gate signals. The gate driver 400 receives a gate-off voltage Voff, the first and second clock signals CKV and CKVB, and an initialization signal INT. All stages $ST_1$-$ST_{n+1}$ are connected one-to-one to the respective gate lines GL1-GLn except for the last stage $ST_{n+1}$.

Each of the stages $ST_1$-$ST_{n+1}$ includes a first clock terminal CK1, a second clock terminal CK2, a set terminal S, a reset terminal R, a gate voltage terminal GV, a frame reset terminal FR, a gate output terminal OUT1, and a carry output terminal OUT2.

In each stage, for example the j-th stage $ST_j$, the set terminal S receives the carry output of the previous stage $ST_{j-1}$, that is to say, the previous carry output Cout(j−1) while the reset terminal R receives the gate output of the next stage $ST_{j+1}$, that is to say, the next gate output Gout(j+1). Also, the first and second clock terminals CK1 and CK2 receive the clock signals CKV and CKVB. The gate voltage terminal GV receives the gate-off voltage Voff, and the frame reset terminal FR receives the initialization signal INT. The gate output terminal OUT1 outputs the gate output Gouto(j), and the carry output terminal OUT2 outputs the carry output Cout(j). The carry output Cout(n+1) of the last stage $ST_{n+1}$ is provided to each stage $ST_1$-$ST_{n+1}$ as the initialization signal INT.

In gate driver 400, the first stage $ST_1$ receives the scanning start signal STV (as opposed to receiving a previous carry output), and the last stage $ST_{n+1}$ receives the scanning start signal STV (as opposed to receiving an output from the next gate). Also, if the first clock terminal CK1 of the j-th stage $ST_j$ receives the first clock signal CKV and the second clock terminal CK2 of the j-th stage $ST_j$ receives the second clock signal CKVB, then the first clock terminals CK1 of the (j−1)-th and the (j+1)-th stages $ST_{j-1}$ and $ST_{j+1}$ that are adjacent to the j-th stage $ST_j$ receive the second clock signal CKVB, and the second clock terminals CK2 thereof receive the first clock signal CKV.

In order to drive the transistor Tr of the pixel, the first and second clock signals CKV and CKVB may, but need not, represent the gate-on voltage Von when the voltage level thereof is high, while the first and second clock signals CKV and CKVB may, but need not, represent the gate-off voltage Voff when the voltage level thereof is low. The first and second clock signals CKV and CKVB may, but need not, have a 50% duty ratio and a 180° phase difference.

Referring to FIG. 5, each stage of the gate driver 400 according to an exemplary embodiment of the present invention, for example the j-th stage, includes an input section 420, a pull-up driving section 430, a pull-down driving section 440, and an output section 450. Illustratively, these elements include NMOS transistors T1-T14, although other types of transistors such as PMOS transistors may be used instead of, or in addition to, NMOS transistors. The pull-up driving section 430 and the output section 450 may include capacitors C1-C3. Note that any of the capacitors C1-C3 may represent a parasitic capacitance between the gate and the drain/source terminals of a transistor formed during manufacturing.

The input section 420 includes three transistors T11, T10, and T5 which are connected in series, source-to-drain, between the set terminal S and the gate voltage terminal GV. The gates of the transistors T11 and T5 are connected to the second clock terminal CK2, and the gate of the transistor T10 is connected to the first clock terminal CK1. The junction point between transistors T11 and T10 is connected to a junction point J1, and the junction point between transistors T10 and T5 is connected to a junction point J2.

The pull-up driving section 430 includes a transistor T4 connected between the set terminal S and the junction point J1, a transistor T12 connected between the first clock terminal CK1 and a junction point J3, and a transistor T7 connected between the first clock terminal CK1 and a junction point J4. The gate and the drain of the transistor T4 are commonly connected to the set terminal S while the source thereof is connected to the junction point J1, and the gate and the drain of the transistor T12 are commonly connected to the first clock terminal CK1 while the source thereof is connected to a junction point J3. The gate of the transistor T7 is connected to both the junction point J3 and the first clock terminal CK1 through a capacitor C1, and the drain thereof is connected to the first clock terminal CK1 while the source thereof is connected to the junction point J4. A capacitor C2 is connected between the junction point J3 and the junction point J4.

The pull-down driving section 440 includes a plurality of transistors T9, T13, T8, T3, T2, and T6, each having a source for receiving the gate-off voltage Voff, and each having a drain for transmitting the gate-off voltage Voff to the junction points J1, J2, J3, and J4. The transistor T9 has a gate connected to the reset terminal R and a drain connected to the junction point j1 while the transistors T13 and T8 have their gates commonly connected to the junction point J2 and their drains connected to the junction points J3 and J4, respectively. The transistor T3 has a gate connected to the junction point J4, and the transistor T2 has a gate connected to the reset terminal R while the transistors T3 and T2 have drains connected to the junction point J2. The transistor T6 has a gate connected to the frame reset terminal FR, a drain connected to the junction point J1, and a source connected to the gate-off voltage terminal GV.

The output section 450 includes a pair of transistors T1 and T14 that each has a source connected to the first clock terminal CK1, each has a drain connected to one of the output terminals OUT1 and OUT2, and each has a gate connected to the junction point J1. The drain of the transistor T1 is connected to the output terminal OUT1 and the drain of the transistor T2 is connected to the output terminal OUT2 The output section 450 includes a capacitor C3 connected between the gate and the drain of the transistor T1, that is, between the junction point J1 and the junction point J2. The drain of the transistor T1 is also connected to the junction point J2.

Now, the operation of an exemplary stage is described. For better comprehension and ease of description, hereinafter, the voltage of a high level of the first and second clock signals CKV and CKVB is referred to as a "high voltage", and the voltage of a low level of the first and second clock signals CKV and CKVB is referred to as a "low voltage" which is approximately equal to the gate-off voltage Voff.

First, when the second clock signal CKVB and the previous carry output Cout(j−1) become high, the transistors T11 and T5 and the transistor T4 are turned on. Then, the two transistors T11 and T4 transmit a high voltage to the junction point J1 while the transistor T5 transmits a low voltage to the junction point J2. Therefore, the transistors T1 and T14 are turned on and the first clock signal CKV is output to the output terminals OUT1 and OUT2. The output voltages Gout(j) and Cout(j) are low voltages because the voltage at the junction point J2 and the voltage of the first clock signal CKV are both low. At about the same time, the capacitor C3 is charged with a voltage representing the difference between the high voltage and the low voltage.

Since the first clock signal CKV, the junction point J2, and the next gate output Gout(j+1) are all at low voltage potentials, all of the transistors T10, T9, T12, T13, T8, and T2 having gates connected to J2 are turned off.

Subsequently, the transistors T11 and T5 are turned off when the second clock signal CKVB becomes low. At the same time, the output voltage of the transistor T1 and the voltage of the junction point J2 become high when the first clock signal CKV becomes high. At this time, since a high voltage is applied to the gate of transistor T10 and the potential of the source connected to the junction point J2 is also the same high voltage, the zero voltage difference between the gate and the source keeps the transistor T10 in its turned-off state. Therefore, the junction point J1 floats, and accordingly, the high voltage of the capacitor C3 is added to the potential of the floating junction point J1.

Since the first clock signal CKV and the junction point J2 are both at a high voltage, the transistors T12, T13, and T8 are turned on. In this state, the transistor T12 and the transistor T13 are connected in series between the high voltage and the low voltage, and accordingly, the potential of the junction point J3 corresponds to a voltage resulting from the source-to-drain resistances of the two turned-on transistors T12 and T13. Here, if the source-to-drain resistance of the turned-on transistor T13 is set to be much greater than the resistance of the turned-on transistor T12 in its resistance state, for example about 10,000 times greater, the voltage of the junction point J3 is substantially the same as the high voltage. Consequently, the transistor T7, connected in series to the transistor T8, is turned on. The potential of the junction point J4 corresponds to a voltage divided by the source-to-drain resistances of the two turned-on transistors T7 and T8. Here, if the resistances of the two transistors T7 and T8 are set up to be substantially the same, the potential of the junction point J4 has a voltage that is intermediate between the high voltage and the low voltage and thus the transistor T3 remains turned-off. At this time, the transistors T9 and T2 also remain turned-off because the next gate output Gout(j+1) is still low. Accordingly, the output terminals OUT1 and OUT2 are connected to only the first clock signal CKV and isolated from a low voltage, thereby transmitting high voltages. Each of the capacitors C1 and C2 is charged with a voltage corresponding to the potential difference across its terminals, and the voltage of the junction point J3 is lower than the voltage of the junction point J5.

Subsequently, when the next gate output Gout(j+1) and the second clock signal CKVB become high and the first clock signal CKV becomes low, the transistors T9 and T2 are turned on, thereby causing low voltages to appear at the junction points j1 and J2. Here, the voltage of the junction point J1 falls to the low voltage upon the discharge of the capacitor C3. It may take some time for the voltage to fall completely to the low voltage owing to the time for discharging the capacitor C3. Therefore, the two transistors T1 and T15 remain turned on for a time after the next gate output Gout(j+1) becomes high, and accordingly, the output terminals OUT1 and OUT2 are connected to the first clock signal CKV to transmit low voltages. Since the output terminal OUT2 is isolated from the first clock signal CKV due to the turned-off transistor T14 after the capacitor C3 becomes discharged such that the potential of the junction point J1 corresponds to a low voltage, the carry output Cout(j) is floating and remains a low voltage. At the same time, when the transistor T1 is turned off, the output terminal OUT1 continuously transmits a low voltage because it is connected to the low voltage through the transistor T2.

The voltage at junction point J3 is floating because the transistors T12 and T13 are turned off. Also, the voltage of the junction point J5 is lower than the voltage of the junction point J4, and the transistor T7 is turned off because the voltage of the junction point J3 remains lower than the voltage of the junction point J5 due to the capacitor C1. Simultaneously, the transistor T3 also remains turned off since the transistor T8 is turned off, thereby causing the voltage of the junction point J4 to be correspondingly lowered. Also, the transistor T10 remains turned off because its gate is connected to the low voltage of the first clock signal CKV and the voltage of the junction point J2 is also low.

Next, when the first clock signal CKV swings high, the transistors T12 and T7 are turned on. The voltage of the junction point J4 increases so that the transistor T3 is turned on and transmits a low voltage to the junction point J2 to make the output terminal OUT1 transmit the low voltage continuously. Even though the output of the next gate output Gout(j+1) is low, the voltage of the junction point J2 may be a low voltage. Since the gate of the transistor T10 is connected to the high voltage of the first clock signal CKV, and the voltage of the junction point J2 is a low voltage, the transistor T10 is turned on to convey the low voltage of the junction point J2 to the junction point J1. The drains of the two transistors T1 and T14 are connected to the first clock terminal CK1 to be continuously supplied with the first clock signal CKV. Note that the transistor T1 can be made larger than the other transistors so as to provide greater current handling ability, enhanced power dissipation, or both. However, increasing the size of T1 also increases the parasitic capacitance of T1 between the gate and the drain. Accordingly, a change in drain voltage may affect gate voltage due to this increased parasitic capacitance. When the first clock signal CKV is high, the transistor T1 may be turned on because of the increase of the gate voltage due to the parasitic capacitance between the gate and the drain. Hence, the transistor T1 may be prevented from being turned on as the transistor T1 continues to convey the low voltage of the junction point J2 to the junction point J1, thereby maintaining the gate voltage of the transistor T1 at a low voltage.

Subsequently, the voltage of the junction point J1 remains at the low voltage until the previous carry output Cout(j−1) becomes high. The voltage of the junction point J2 is a low voltage via the transistor T3 when the first clock signal CKV is high and the second clock signal CKVB is low. Otherwise, when the first clock signal CKV is low and the second clock signal CKVB is high, the voltage of the junction point J2 remains a low voltage via the transistor T5. The transistor T6 receives the initialization signal INT and the carry output Cout(n+1) from the last stage $ST_{n+1}$, and transmits the gate-off voltage Voff to the junction point J1, thereby setting the voltage of the junction point J1 to a low voltage once more. In this manner, the stage $ST_j$ generates the carry signal Cout(j) and the gate signal Gout(j) based on the previous carry signal Cout(j−1) and the next gate signal Gout(j+1), as well as in synchronization with the first and second clock signals CKV and CKVB.

As mentioned previously, by directly generating a signal having a period that is about twice the pulse width of the gate signal in the signal controller, the structure of the signal controller as well as the structure of the signal generator can be more simplified relative to prior art techniques for generating various signals. When the signal generator is implemented as a separate chip, the cost is decreased since more than one input pin can be omitted, and the cost can also be decreased when the signal generator itself is omitted.

Although preferred embodiments of the present invention have been described in detail hereinbefore, it should be clearly understood that many variations and/or modifications of the basic inventive concepts herein taught, which may appear to those skilled in the present art, will still fall within the spirit and scope of the present invention, as defined in the appended claims.

What is claimed is:

1. A display device comprising:
   a gate line for transmitting a gate signal;
   a data line for transmitting a data signal;
   a switching element connected to the gate line and the data line;
   a pixel electrode connected to the switching element;
   a gate driver connected to the gate line and including a gate signal generation mechanism for generating the gate signal and applying the gate signal to the gate line;
   a data driver for applying the data signal to the data line;
   a signal controller for receiving and processing an incoming image signal to be supplied to the data driver, the signal controller for generating a first clock signal for controlling the gate driver and for generating a data control signal for controlling the data driver; and
   a signal generator for receiving the first clock signal and for generating a second clock signal and a third clock signal based on only the received first clock signal, wherein the received first clock signal is a single signal,
   wherein the gate driver is capable of receiving the second and third clock signals,
   wherein the gate driver generates the gate signal based on the second and third clock signals, and
   wherein the first clock signal is a periodic signal having a first period, the second clock signal is a periodic signal having a second period, and the third clock signal is a periodic signal having a third period, and the first period is substantially equal to the second period.

2. The display device of claim 1, wherein the gate signal generation mechanism applies the gate signal to the gate line.

3. The display device of claim 1, wherein the first clock signal has a first phase and the second clock signal has a second phase, and the first phase is substantially equal to the second phase.

4. The display device of claim 1, wherein the second clock signal has a second phase and the third clock signal has a third phase, and the phase difference between the second phase and the third phase is about 180 degrees.

5. The display device of claim 1, wherein the gate driver includes a first stage and a second stage, wherein the second clock signal is supplied to the first stage and the third clock signal is supplied to the second stage.

6. The display device of claim 1, wherein the gate signal includes a plurality of pulses.

7. The display device of claim 6, wherein the gate signal includes a pulse sequence comprised of a plurality of periodic pulses, the periodic pulses having a pulse width substantially equal to half of the first period.

8. The display device of claim 1, wherein the signal generator is combined with the signal controller.

9. The display device of claim 1, wherein the signal generator comprises:
   an amplifier for amplifying the first clock signal to generate the second clock signal; and
   an inverter for inverting the second clock signal to generate the third clock signal.

10. A display device comprising:
    a gate line for transmitting a gate signal;
    a data line for transmitting a data signal;
    a switching element connected to the gate line and the data line;
    a pixel electrode connected to the switching element;
    a gate driver connected to the gate line and including a gate signal generation mechanism for generating the gate signal and applying the gate signal to the gate line;
    a data driver for applying the data signal to the data line;
    a signal controller for receiving and processing an incoming image signal to be supplied to the data driver, the signal controller for generating a first clock signal for controlling the gate driver and for generating a data control signal for controlling the data driver; and
    a signal generator for receiving the first clock signal and for generating a second clock signal and a third clock signal based on only the received first clock signal, wherein the received first clock signal is a single signal,
    wherein the gate driver is capable of receiving the second and third clock signals,
    wherein the gate driver generates the gate signal based on the second and third clock signals,
    wherein the gate signal includes a pulse having a pulse width, and
    wherein the first clock signal is a periodic signal having a first period which is about equal to twice the pulse width of the gate signal.

11. The display device of claim 10, wherein the gate signal generation mechanism applies the gate signal to the gate line.

12. The display device of claim 10, wherein the second clock signal is a periodic signal having a second period which is substantially equal to the first period, and the second clock signal has about the same phase as the first clock signal.

13. The display device of claim 12, wherein the third clock signal is a periodic signal having a third period, and the phase difference between the third clock signal and the second clock signal is about 180 degrees.

14. The display device of claim 13, wherein the gate driver includes a first stage and a second stage, wherein the second clock signal is applied to the first stage and the third clock signal is applied to the second stage.

15. The display device of claim 12, wherein the signal generator comprises:
   an amplifier for amplifying the first clock signal to generate the second clock signal; and
   an inverter for inverting the second clock signal to generate the third clock signal.

16. The display device of claim 5, wherein the signal controller generates a start signal and applies the start signal to only one stage of the first and second stages.

17. The display device of claim 14, wherein the signal controller generates a start signal and applies the start signal to only one stage of the first and second shift stages.

18. The display device of claim 1, wherein the switching element includes a first thin film transistor.

19. The display device of claim 18, wherein the first thin film transistor includes amorphous silicon.

20. The display device of claim 18, wherein the gate signal generation mechanism includes a plurality of second thin film transistors.

21. The display device of claim 18, wherein the gates line, the data line, the first thin film transistor, the pixel electrode, and the gate driver are integrated on a substrate.

22. A gate driving unit, comprising:
   a signal controller for generating a first clock signal for controlling a gate driver and for generating a data control signal for controlling a data driver;
   a signal generator for receiving the first clock signal and for generating a second clock signal and a third clock signal based on only the received first clock signal, wherein the received first clock signal is a single signal;
   wherein the gate driver is capable of receiving the second and third clock signals, and
   wherein the first clock signal is a periodic signal having a first period, the second clock signal is a periodic signal having a second period, and the third clock signal is a periodic signal having a third period, and the first period is substantially equal to the second period.

23. The gate driving unit of claim 22, wherein the first clock signal has a first phase and the second clock signal has a second phase, and the first phase is substantially equal to the second phase.

24. The gate driving unit of claim 22, wherein the second clock signal has a second phase and the third clock signal has a third phase, and the phase difference between the second phase and the third phase is about 180 degrees.

25. The gate driving unit of claim 22, wherein the gate driver includes at least a first stage and a second stage, wherein the second clock signal is supplied to the first stage and the third clock signal is supplied to the second stage.

26. The gate driving unit of claim 22, wherein the gate signal includes a plurality of pulses.

27. The gate driving unit of claim 22, wherein the gate signal includes a pulse sequence comprised of a plurality of periodic pulses, the periodic pulses having a pulse width substantially equal to half of the first period.

28. The gate driving unit of claim 22, wherein the signal generator is combined with the signal controller.

29. The gate driving unit of claim 22, wherein the signal generator comprises:
   an amplifier for amplifying the first clock signal to generate the second clock signal; and
   an inverter for inverting the second clock signal to generate the third clock signal.

* * * * *